United States Patent [19]
Norimatsu

[11] Patent Number: 6,081,701
[45] Date of Patent: Jun. 27, 2000

[54] GAIN CONTROLLER

[75] Inventor: Hidehiko Norimatsu, Tokyo, Japan

[73] Assignee: NEC Corporation, Japan

[21] Appl. No.: 09/060,632

[22] Filed: Apr. 15, 1998

[30] Foreign Application Priority Data

Apr. 21, 1997 [JP] Japan ................................. 9-103625

[51] Int. Cl.[7] .................................................. H04Q 7/32
[52] U.S. Cl. ........................................................ 455/232.1
[58] Field of Search ................................. 455/127, 136, 455/137, 138, 194.2, 92, 232.1, 245.1, 250.1, 341, 13.4, 116, 234.1, 235.1, 241.1, 245.2, 246.1, 303, 306, 308; 330/129, FOR 133, 134; 375/345

[56] References Cited

U.S. PATENT DOCUMENTS

| | | | |
|---|---|---|---|
| 3,848,194 | 7/1973 | Nishimura et al. ......................... | 30/134 |
| 5,179,731 | 1/1993 | Trankle et al. ........................... | 455/291 |
| 5,371,800 | 12/1994 | Komatsu et al. ........................ | 330/129 |
| 5,432,473 | 7/1995 | Mattila et al. ............................ | 330/133 |
| 5,514,703 | 5/1996 | Maher et al. ............................. | 330/133 |
| 5,862,460 | 9/1996 | Rich ......................................... | 455/116 |
| 5,862,461 | 8/1996 | Yoshizawa ............................... | 455/127 |
| 5,867,063 | 12/1996 | Snider et al. ............................ | 330/133 |
| 5,898,337 | 6/1997 | Inahasi ..................................... | 330/134 |

FOREIGN PATENT DOCUMENTS

| | | |
|---|---|---|
| 62-312209 | 2/1987 | Japan . |
| 1-264405 | 10/1989 | Japan . |
| 1-305610 | 12/1989 | Japan . |
| 2-100406 | 4/1990 | Japan . |
| 4-258006 | 9/1992 | Japan . |
| 10-32441 | 2/1998 | Japan . |
| 10-209780 | 8/1998 | Japan . |

OTHER PUBLICATIONS

Japenese Office Action dated Oct. 26, 1999 issued in a related application.

English translation of relevant portions of Oct. 26, 1999 Japenese Office Action.

*Primary Examiner*—Dwayne D. Bost
*Assistant Examiner*—Jean A. Gelin
*Attorney, Agent, or Firm*—Ostrolenk, Faber, Gerb & Soffen, LLP

[57] ABSTRACT

In a portable apparatus in a digital cellular system in which transmission and reception is simultaneously conducted in a particularly wide variable output range, efficiency is improved in a low-power output operation and there is minimized the influence upon discontinuous output waveforms appearing in a gain changing operation. There are included a distributor to distribute an input signal to two paths, a first gain control amplifier, a linear power amplifier, a driver amplifier, a filter, a switching circuit to turn power of the linear power amplifier on and off, and a second gain control amplifier. Outputs from the linear power and gain control amplifiers are mixed with each other by a mixer. Gains of these amplifiers are separately controlled by a control circuit, which also controls on and off of the switching circuit.

10 Claims, 3 Drawing Sheets

GAIN CONTROLLER

BACKGROUND OF THE INVENTION

The present invention relates to a gain controller for controlling a gain of an input signal thereto, and in particular, to a gain controller suitably used for portable apparatuses in a digital system.

DESCRIPTION OF THE RELATED ART

For example, in the Japanese patent Laid-Open Application Serial No. 4-3608, there has been described a conventional technology associated with the gain controller, specifically, an apparatus to cover a wide dynamic range in which a power source voltage in a power amplifying stage is regulated to particularly improve linearity with respect to a control voltage in a low-power operation. Furthermore, described in the Japanese Patent Laid-Open Application Serial No. 6-152495 is a technology to adjust efficiency in a radio transmission when using a time division multiple access (TDMA).

Although the conventional technology disclosed in the Japanese patent Laid-Open Application Serial No. 4-3608 improves controllability in the low-power operation, there still exists a problem of improvement in efficiency because an amplifier designed for a high-power operation is utilized even in a low-power operation.

Additionally, the technology described in the Japanese patent Laid-Open Application Serial No. 6-152495 is effectively applied to a system employing the TDMA, i.e., in a system in which transmission and reception are carried out respectively during different periods of time. However, when adopting the technology in a system conducting transmission and reception at the same time, it is required to cope with a problem of discontinuous points which may appear if efficiency is desired to be changed.

SUMMARY OF THE INVENTION

It is therefore an object of the present invention to provide a gain controller capable of improving efficiency in a low-power operation of portable apparatuses in a digital cellular system which achieves transmission and reception at the same time particularly in a wide variable output range and minimizing influence upon discontinuous output waveforms which possibly appear in a gain changing operation.

To achieve the object above in accordance with the present invention, there is provided a gain controller comprising distributing means for distributing an input signal to a first path and a second path, first gain control means for controlling a gain of an output from the distributing means arranged on the first path, linear power amplifier means for linearly amplifying an output from the first gain control means, second gain control means for controlling a gain of an output from the distributing means arranged on the second path switching means for turning a power source of the linear power amplifier means, control means for separately controlling gains respectively of the first and second gain control means and controlling the switching means, and mixer means for mixing an output from the linear power amplifier means with an output from the gain control means and outputting therefrom an output resultant from the mixing operation.

Furthermore, it may also be favorable that the control means sets, when a high-power output is desired to be obtained from the mixer means, the gain of the first gain control means to a high value and that of the second gain control means to a low value and sets, when a low-power output is desired to be obtained from the mixer means, the gains respectively of the first and second gain control means in a reverse manner.

In addition, the control means may also achieve, when the gain of the first gain control means is equal to or less than a predetermined value, a control operation to turn the switching means off.

Moreover, it is favorable that the switching means turns also a power source of the first gain control means on and off.

Additionally, the gain controller may further includes a driver amplifier in a stage prior to the linear power amplifier means such that the switching means turns also a power source of the driver amplifier on and off.

It may also desirable that the gain controller further includes an isolator at least between the linear power amplifier means and the mixer means or between the second gain control means and the mixer means.

Furthermore, the gain controller may further include an amplifier in a stage after the second gain control means.

In addition, it is favorable that the second gain controller further includes a filter in a stage after the second gain control means.

The linear power amplifier means favorably includes the first gain control means.

Moreover, it is also desirable that the distributing means distributes the input signal at least one other path having a configuration substantially similar to a configuration of the second path.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring next to the accompanying drawings, description will be given of an embodiment of the gain controller in accordance with the present invention.

Figure 1:
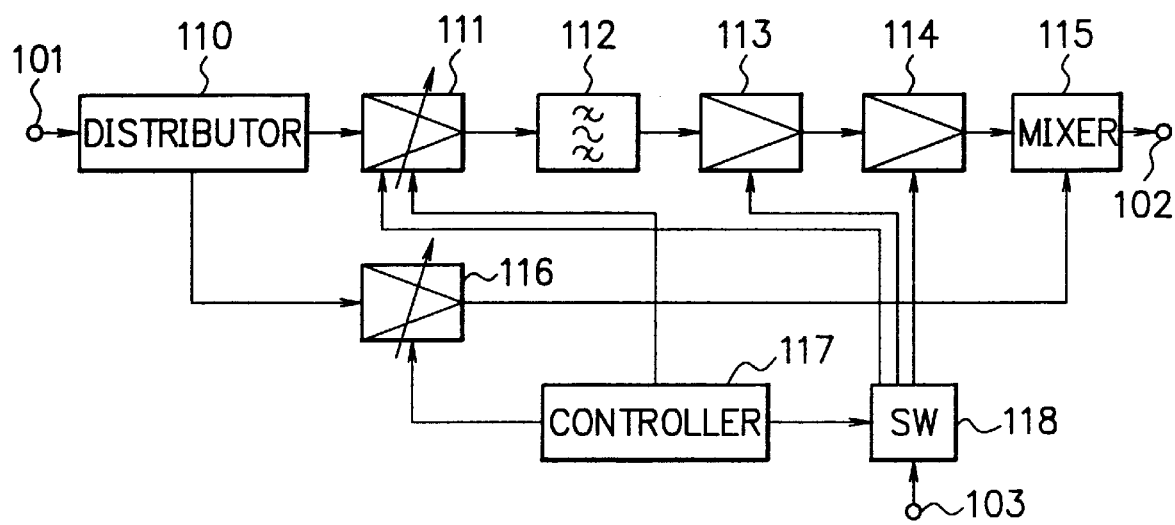
FIG. 1 is a schematic block diagram showing the configuration of a first embodiment of the gain controller in accordance with the present invention.

FIG. 1 shows the configuration of a first embodiment of the gain controller in accordance with the present invention. The construction of FIG. 1 includes a distributor 110 which receives an input signal via an input terminal 101 to distribute the signal via two paths to first and second gain control amplifiers 111 and 116. The first amplifier 111 produces an output signal to feed the signal via a filter 112 and a driver amplifier 113 to a linear power amplifier 114. The signal is amplified by the amplifier 114 to be delivered to a mixer 115. On the other hand, the second gain control amplifier 116 creates an output signal to be supplied to the mixer 115. Resultantly, the signal is mixed with the output signal from the linear power amplifier 114 such that a signal resultant from the mixing operation is delivered from an output terminal 102.

Furthermore, the embodiment includes a power supply 103 producing a voltage signal to be applied via a switching circuit 118 to the linear power amplifier 114, the driver amplifier 113, and the first gain control amplifier 111. Also included in the system is a control circuit 117 which supervises operations of the first and second gain control amplifiers 111 and 116 and the switching circuit 118.

Subsequently, description will be given of operation of the first embodiment configured as above.

Figure 2:
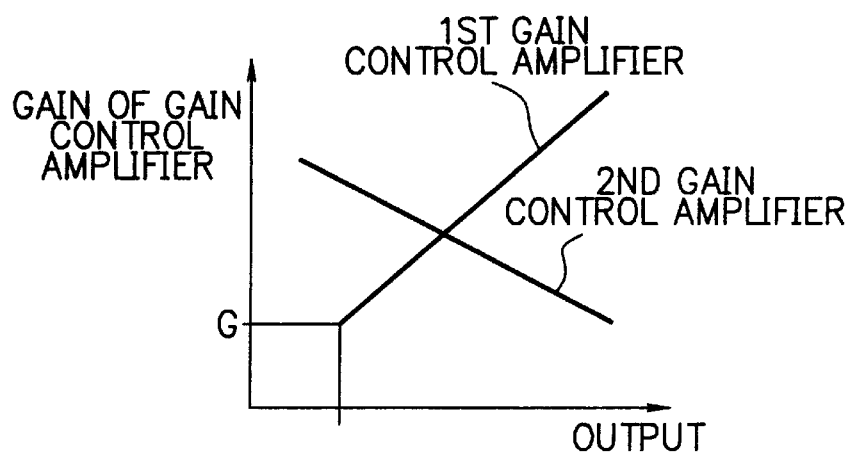
FIG. 2 is a graph showing characteristics between an output level and a gain setting value in the first embodiment.

FIG. 2 shows characteristics of respective amplifiers producing desired outputs when the first and second gain control amplifiers are appropriately controlled. For large output values, the gains respectively of the first and second gain control amplifiers 111 and 116 are set to large and small gain values, respectively. In this situation, primary signals are transmitted via the first path related to the first gain control amplifier 111. When low output values are desired, the relationship above is reversed.

Since the gains of respective amplifiers are continuously changed as above, there can be minimized influence of discontinuity associated with the gain changes. When the gain of the first gain control amplifier 111 is less than a predetermined gain G, the switching circuit 118 is activated to conduct a change-over operation so as to turn power of the first amplifier 11, the drive amplifier 113, and the linear power amplifier 114 off. This advantageously reduces current consumption of these circuits substantially to zero. When the predetermined gain is set to a value sufficiently lower than a level of the distribution path (second path) related to the second gain control amplifier 116, it is possible to minimize influence such as a glitch associated with a power-off operation.

Figure 3:
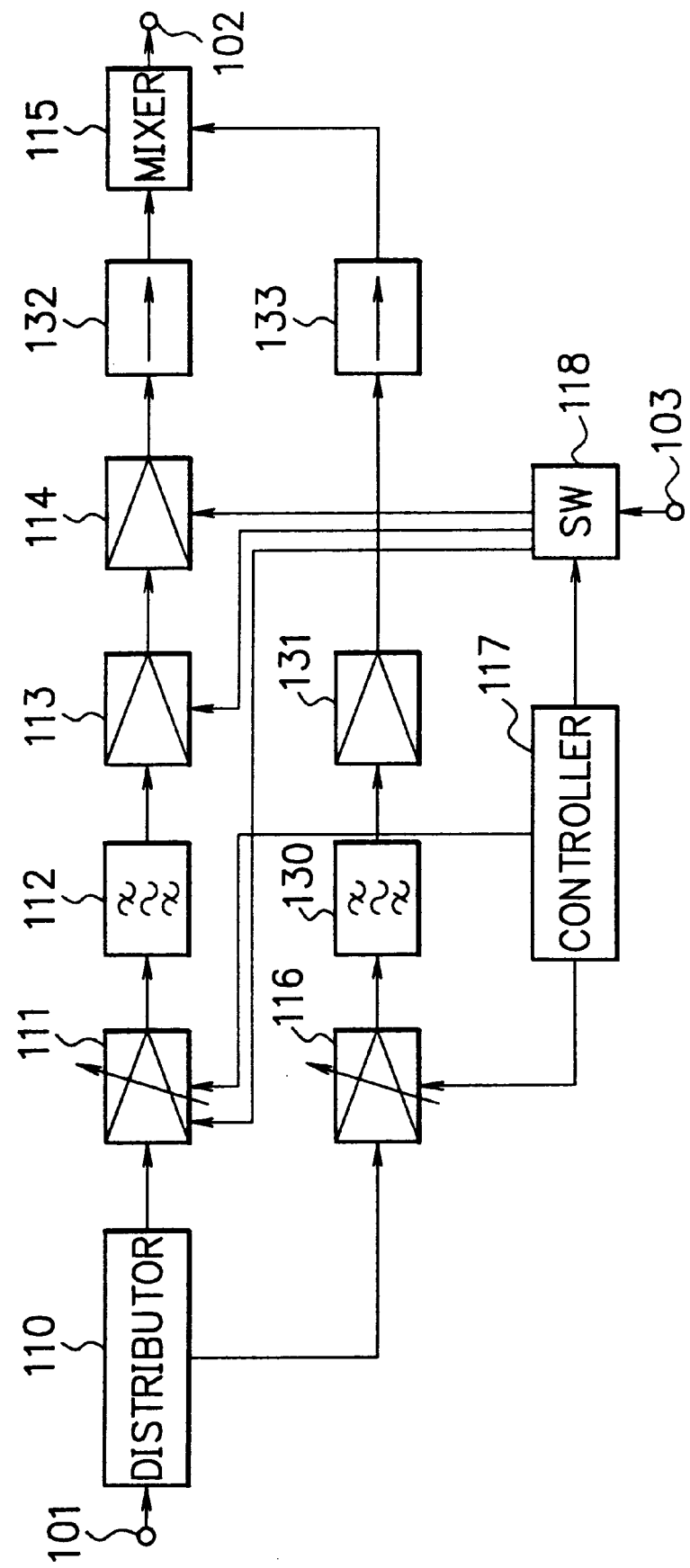
FIG. 3 is a block diagram showing a second embodiment of the gain controller in accordance with the present invention.

FIG. 3 shows a second embodiment of the gain controller in accordance with the present invention. In this block diagram, the same components as those of FIG. 1 are assigned with the same reference numerals and will not be described in this specification.

The configuration of this embodiment includes a filter 130, an amplifier 131, and an isolator 132 in the distribution path related to the second gain control amplifier 116. Moreover, inserted in the primary path is an isolator 133. There does not occur any trouble even when filter and amplifier functions are added to the distribution path. Depending on an input impedance of the mixer 115, the isolators 132 and 133 may be installed therein to guarantee precision of the output level.

Next, operation of the second embodiment will be described.

Figure 4:
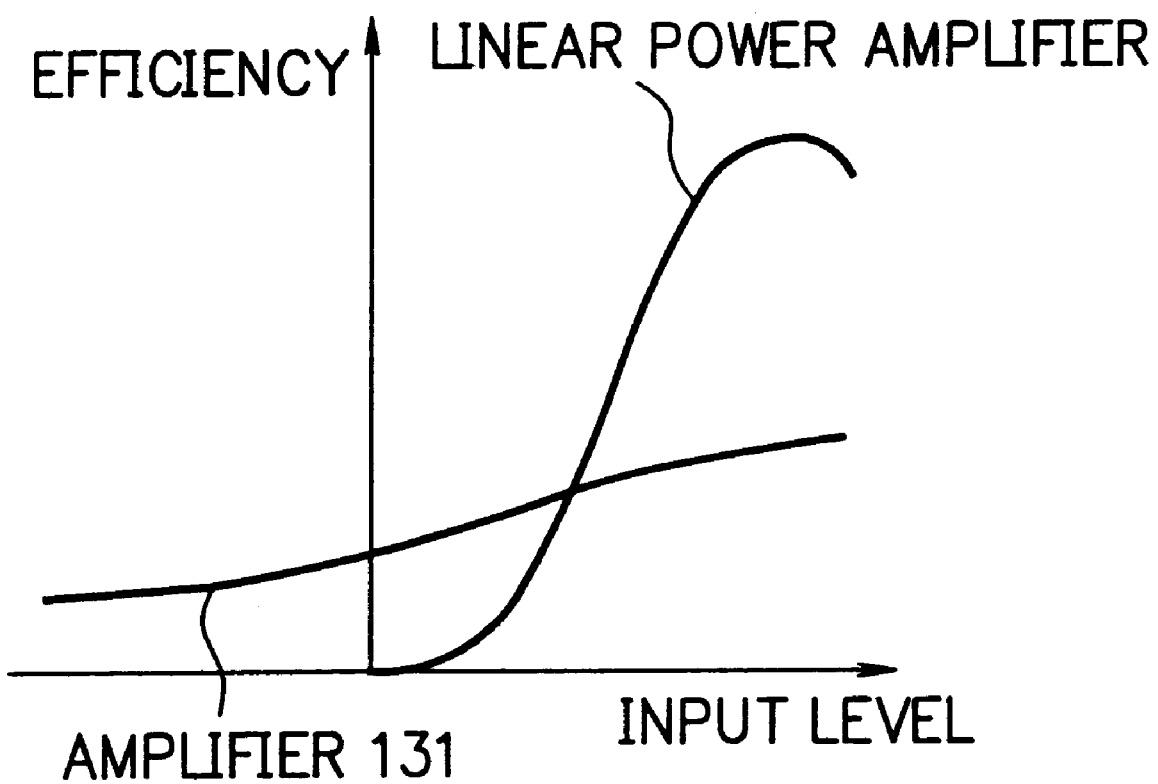
FIG. 4 is a graph showing characteristics between input levels of an amplifier and a linear power amplifier and efficiency in the second embodiment.

FIG. 4 shows in a graph an example of relationships of efficiency of the linear power amplifier 114 and the amplifier 131 and input levels respectively thereof. For high input levels, i.e., for high output values, the linear power amplifier 114 operates with a high efficiency. Namely, it is possible on this occasion to lower current consumption of the system. On the other hand, when there are desired high input levels, i.e., high output values, the relationship above is inverted. That is, current consumption of the system can be minimized by mainly operating the amplifier 131.

Incidentally, even when the amplifier 131 or 130 is removed to minimize the number of parts or for some other reasons, since the efficiency of the second gain control amplifier 116 is remarkably higher than that of the linear power amplifier 114 in the ordinary low-power operation, the current consumption is similarly reduced as above.

Additionally, the configuration may includes a plurality of distribution paths. In such a case, the advantageous effect can be similarly obtained through substantially the same control operation of the system. In this situation, there may be arranged an amplifier having optimal efficiency in each distribution path such that efficiency can be controlled more precisely by selectively using the amplifiers.

In accordance with the present invention as described above, since the configuration includes two paths such that the gain can be controlled independently for each path, the output level for the optimal efficiency varies between these paths. This makes it possible to select one of the paths for the optimal efficiency depending on a desired output value.

Thanks to a control operation to continuously change the gain of each path in association with an objective output value, the adverse influence of discontinuity can be minimized.

Moreover, when the gain of the first path is less than a predetermined value, power of the linear power amplifier is turned off so that current consumption is reduced and the drawbacks such as a glitch occurring in relation to a power-off operation is minimized.

When a power source and/or a driver amplifier are/is arranged for the gain control unit of the first path, current consumption can be further reduced.

By installing an isolator in either one of the paths, the output level precision can be guaranteed in association with the input impedance of the mixer.

When an amplifier is disposed in the second path for the operation in a low-power state, power consumption of the system can be considerably minimized.

By arranging a filter in the second path, the precision of control operation can be improved.

In addition, when a gain control function is provided for the linear power amplifier, the structure of the system can be simplified.

The control operation can be achieved with a higher precision by increasing the number of paths.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A gain controller, comprising:
   distributing means for distributing an input signal to a first path and a second path;
   first gain control means for controlling a gain of an output from the distributing means arranged on the first path;
   linear power amplifier means for linearly amplifying an output from the first gain control means;
   second gain control means for controlling a gain of an output from the distributing means arranged on the second path;
   switching means for turning a power source of the linear power amplifier means;
   control means for separately controlling gains respectively of the first gain control means and controlling the switching means; and
   mixer means for mixing an output from the linear power amplifier means with an output from the gain control means and outputting therefrom an output resultant from the mixing operation.

2. A gain controller in accordance with claim 1, wherein the control means sets, when a high-power output is desired to be obtained from the mixer means, the gain of the first gain control means to a high value and that of the second gain control means to a low value and sets, when a low-power output is desired to be obtained from the mixer means, the gains respectively of the first and second gain control means in a reverse manner.

3. A gain controller in accordance with claim 1, wherein the control means achieves, when the gain of the first gain control means is equal to or less than a predetermined value, a control operation to turn the switching means off.

4. A gain controller in accordance with claim 1, wherein the switching means turns also a power source of the first gain control means on and off.

5. A gain controller in accordance with claim 1, further including a driver amplifier in a stage prior to the linear power amplifier means, the switching means turning also a power source of the driver amplifier on and off.

6. A gain controller in accordance with claim 1, further including an isolator between at least between the linear power amplifier means and the mixer means and between the second gain control means and the mixer means.

7. A gain controller in accordance with claim 1, further including an amplifier in a stage after the second gain control means.

8. A gain controller in accordance with claim 1, further including a filter in a stage after the second gain control means.

9. A gain controller in accordance with claim 1, wherein the linear power amplifier means includes the first gain control means.

10. A gain controller in accordance with claim 1, wherein the distributing means distributes the input signal at least one other path having a configuration substantially similar to a configuration of the second path.

* * * * *